(12) United States Patent
Gerstenhaber et al.

(10) Patent No.: US 7,436,052 B2
(45) Date of Patent: Oct. 14, 2008

(54) REPATTERNED INTEGRATED CIRCUIT CHIP PACKAGE

(75) Inventors: Moshe Gerstenhaber, Newton, MA (US); Chau C. Tran, Malden, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/067,795

(22) Filed: Feb. 28, 2005

(65) Prior Publication Data
US 2005/0139892 A1  Jun. 30, 2005

Related U.S. Application Data

(62) Division of application No. 09/679,658, filed on Oct. 4, 2000, now Pat. No. 6,876,070.

(51) Int. Cl.
*H01L 23/02* (2006.01)
(52) U.S. Cl. ............... 257/678; 257/697; 257/E27.016

(58) Field of Classification Search ............... 257/678, 257/695, 697, 690, 692, 296, 298, 300, E51.003, 257/E51.025, E27.016, E27.019; 330/9, 330/252, 257, 258, 307
See application file for complete search history.

(56) References Cited

U.S. PATENT DOCUMENTS

| | | | | |
|---|---|---|---|---|
| 4,714,067 A | * | 12/1987 | Staerzl | 123/494 |
| 5,075,633 A | * | 12/1991 | Bowers | 330/69 |
| 5,790,295 A | * | 8/1998 | Devon | 398/202 |
| 6,445,603 B1 | * | 9/2002 | Abedifard | 365/51 |

* cited by examiner

*Primary Examiner*—Theresa T. Doan
*Assistant Examiner*—Dilinh Nguyen
(74) *Attorney, Agent, or Firm*—Iandiorio Teska & Coleman

(57) ABSTRACT

A repatterned integrated circuit chip package which balances and/or reduces the package capacitance associated with the gain resistor terminals to reduce the degradation of common mode rejection with frequency.

5 Claims, 4 Drawing Sheets

COMMON MODE REJECTION RATIO VS. FREQUENCY ature
REPATTERNED INTEGRATED CIRCUIT CHIP PACKAGE

RELATED APPLICATIONS

This application is a divisional application of U.S. patent application Ser. No. 09/679,658 filed Oct. 4, 2000, now U.S. Pat. No. 6,876,070 herein incorporated by reference.

FIELD OF THE INVENTION

This invention relates to a repatterned integrated circuit chip package for reducing common mode error with frequency due to package capacitance and more particularly to such a repatterned integrated circuit chip package for an instrumentation amplifier.

BACKGROUND OF THE INVENTION

Amplifiers, such as for example, instrumentation amplifiers, are used to process normal mode signal and reject common mode signals. A shortcoming of such amplifiers is the degrading of their rejection of common mode signals with increasing frequency.

SUMMARY OF THE INVENTION

It is therefore an object of this invention to provide an improved integrated circuit chip package with repatterned pin connections for reducing common mode error with frequency.

It is a further object of this invention to provide an improved integrated circuit chip package with repatterned pin connections for reducing the effect of package capacitances.

This invention results from the realization that the underlying problem in degradation of common mode signal rejection with frequency is really due to package capacitance which is the parasitic capacitance developed between a power supply pin and a gain resistor pin and thus the common mode rejection could be dramatically improved by decreasing the effect of the package capacitance which can be done in any one or more of the following ways, by subjecting the gain resistor terminal of each amplifier stage to a power supply pin to balance the effect of the package capacitance or by spacing each power supply pin an equal distance from a respective one of the gain resistor pins or by not connecting the gain resistor terminals to external pins where they could be subject to parasitic capacitance coupling to the power supply pins or by separating the power supply pins and gain resistor pins by a greater distance with at least one other pin separating them, or by installing a compensating capacitor in the circuit connected to the other gain resistor terminal to balance the effect of the package capacitance.

This invention features a repatterned integrated circuit chip package including first and second power supply terminals, first and second input terminals, first and second output terminals, and first and second gain resistor terminals. There is a plurality of connection pins on the package for interconnecting with the terminals. The first and second power supply terminals are connected to pins which are equally spaced from the pins to which the first and second gain resistor terminals are connected for balancing the effect of package capacitance and reducing the common mode error with frequency.

This invention also features a repatterned integrated circuit chip package including first and second power supply terminals, first and second input terminals, first and second output terminals, and first and second gain resistor terminals. There are a plurality of connection pins on the package for interconnecting with the terminals. The first and second power supply terminals are connected to pins which are spaced from the first and second gain resistor terminal pins with at least one other of the pins between them, respectively, for reducing package capacitance and reducing the common mode error with frequency.

This invention also features a repatterned integrated circuit chip package including first and second power terminals, first and second input terminals, first and second output terminals, and first and second gain resistor terminals. There are a plurality of connection pins on the package for interconnecting with said terminals. The first and second power supply terminals, input and output terminals are connected to selected ones of the pins. But the first and second resistor terminals are unattached to any pins for reducing package capacitance and common error with frequency.

This invention also features a repatterned integrated circuit chip package including first and second power terminals, first and second input terminals, first and second output terminals, and first and second gain resistor terminals. There are a plurality of connection pins on the package for interconnecting with the terminals. A compensating capacitor is connected to one of the gain resistor terminals to balance the effect of the package capacitance of the other gain resistor terminal and reduce the common error with frequency.

In a preferred embodiment one of the output terminals and one of the power supply terminals may be connected together and to a single pin.

BRIEF DESCRIPTION OF THE DRAWINGS

Other objects, features and advantages will occur to those skilled in the art from the following description of a preferred embodiment and the accompanying drawings, in which.

DISCLOSURE OF A PREFERRED EMBODIMENT

Figure 1:
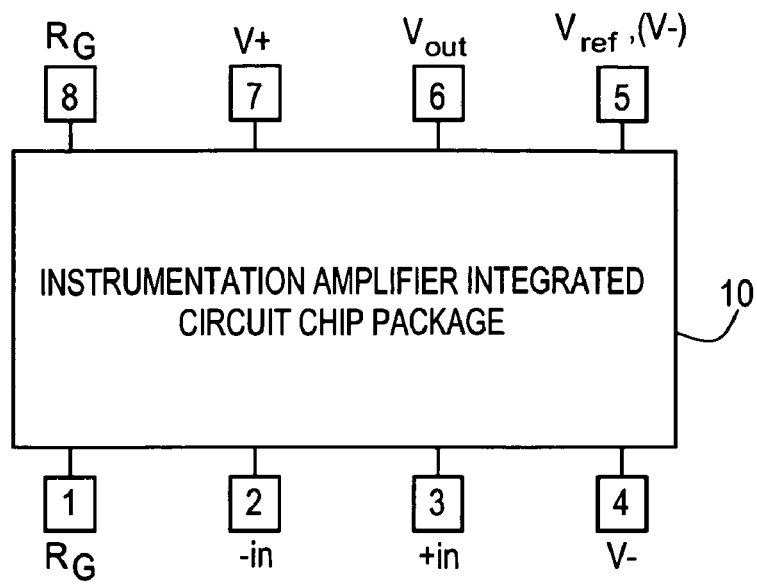
FIG. 1 is a schematic block diagram of a prior art integrated circuit chip package showing a conventional pin pattern.

There is shown in FIG. 1 an integrated circuit chip package 10 according to the prior art, such as an instrumentation amplifier, which typically includes eight pins for external connection numbered 1, 2, 3, 4, 5, 6, 7, and 8. Pins 1 and 8, labeled $R_G$, are the gain resistor pins to which an external resistance can be connected to set the overall gain of the amplifier. Pins 7 and 4, labeled V+/V−, are meant to connect to the power supply and may be thought of as an AC ground.

One of the power supply pins, 7 or 4, for example pin 4, labeled V−, may actually be connected to ground or to a reference level. Pins 2 and 3, − input and + input, respectively, provide the input to circuit 10 while the output is taken across pins 5 and 6 labeled $V_{out}$ and $V_{ref}$. In fact $V_{ref}$, pin 5, and V−, pin 4, may be connected together to provide the reference for both the power supply and output.

Figure 2:
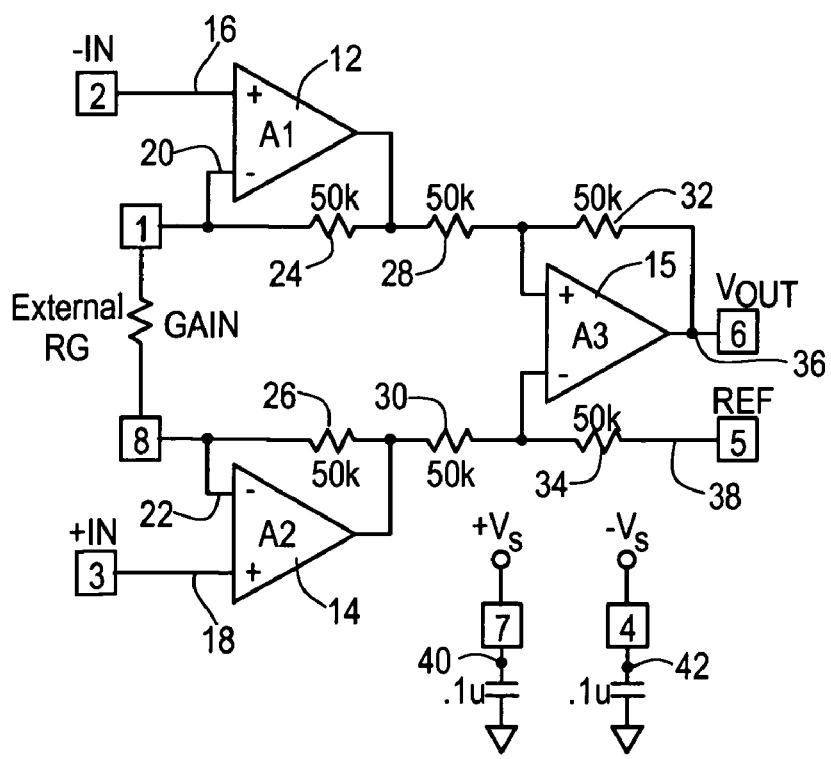
FIG. 2 is a schematic block diagram of one circuit that may be implemented in the integrated circuit chip package of FIG. 1, namely an instrumentation amplifier.

The circuit actually borne by integrated circuit chip package 10 may be any suitable electronic circuit but in this embodiment is shown as an instrumentation amplifier as pictured in more detail in FIG. 2 where it can be seen as consisting of three operational amplifiers, 12, 14, and 15. Amplifiers 12 and 14 operate as differential to differential amplifiers or single-ended to differential amplifiers. Each amplifier, 12 and 14, has its non-inverting input terminals, 16 and 18, connected to one of the input pins, 2 and 3 respectively. Its inverting terminals, 20 and 22, are connected to gain resistance pins 1 and 8, the external gain resistance pins. Resistances 24 and 26 function as feedback resistors for amplifiers 12 and 14. Amplifier 15 has associated with it four resistances, 28, 30, 32, and 34, and its terminals, 36 and 38, are connected to the $V_{out}$ pin 6 and the other output pin 5, labeled $V_{ref}$. Power is supplied to the circuit to by $+V_S$ terminal 40 and $-V_S$ terminal 42, which are connected to pins 7 and 4, respectively. Although these provide power to all three amplifiers, the connections are not shown in the interest of simplicity and clarity.

Figure 2A:
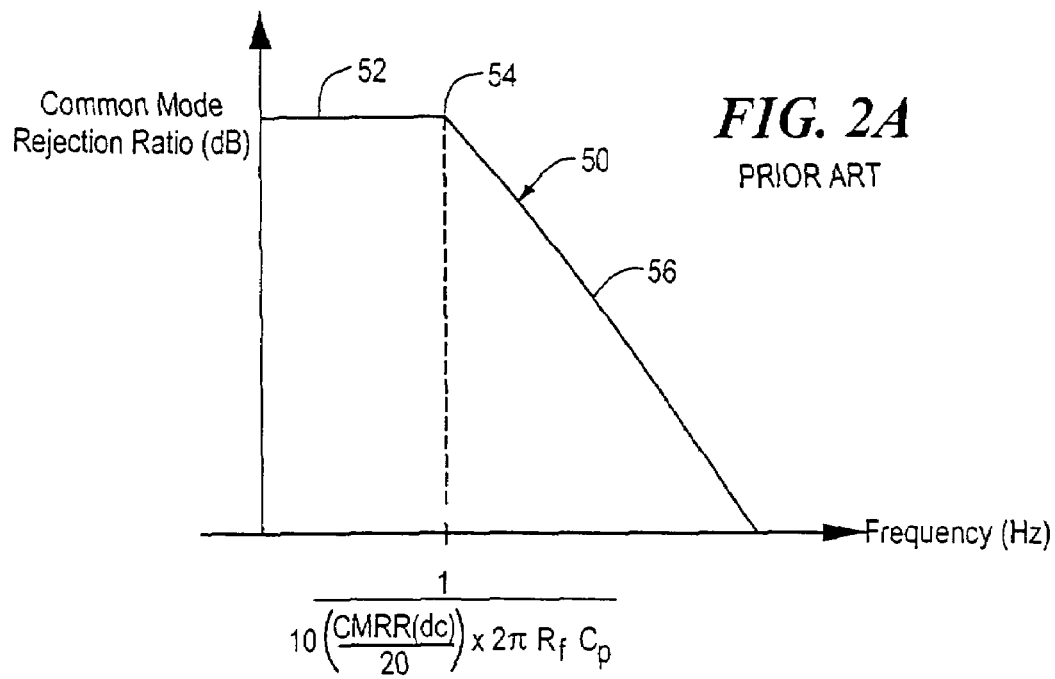
FIG. 2A is an illustration of the fall off in common mode rejection ratio with frequency, that is a common problem in integrated circuit chip packages.

In actual operation it has been determined that these circuits exhibit a high common mode rejection ratio at low frequencies which falls off rather abruptly as the frequency increases. For example as shown in FIG. 2A, where the common mode rejection ratio is shown on the ordinate in dB and the frequency is indicated along the abscissa, the characteristic 50 of common mode rejection ratio stays high in the area of 52, then abruptly falls off at the knee 54, and drops steadily through section 56. This can be predicted by the expression $$f = \left( \frac{1}{10^{\frac{CMRR(dc)}{20}}} \times 2\pi R_F C_P \right),$$

where $R_F$ is the feedback resistance for amplifier 14 and $C_P$ is the package capacitance 60a which affects the gain of amplifier 14a. This means that any common mode signals of higher frequency will not be rejected well and will show up in the output signal, causing errors in interpretation.

This problem has been widely recognized, but not fully understood. It is now understood in accordance with this invention, that the cause of this common mode rejection ratio characteristic 50 is actually a feature of parasitic capacitance called package capacitance. Namely it is the result of the close proximity between an AC ground or DC source and one of the gain resistor terminals. The conditions for this are set by the typical pin pattern in an integrated circuit chip as described with respect to FIG. 1. There it can be seen that the V+ pin 7 is immediately adjacent to one of the gain resistor pins 8.

Figure 3:
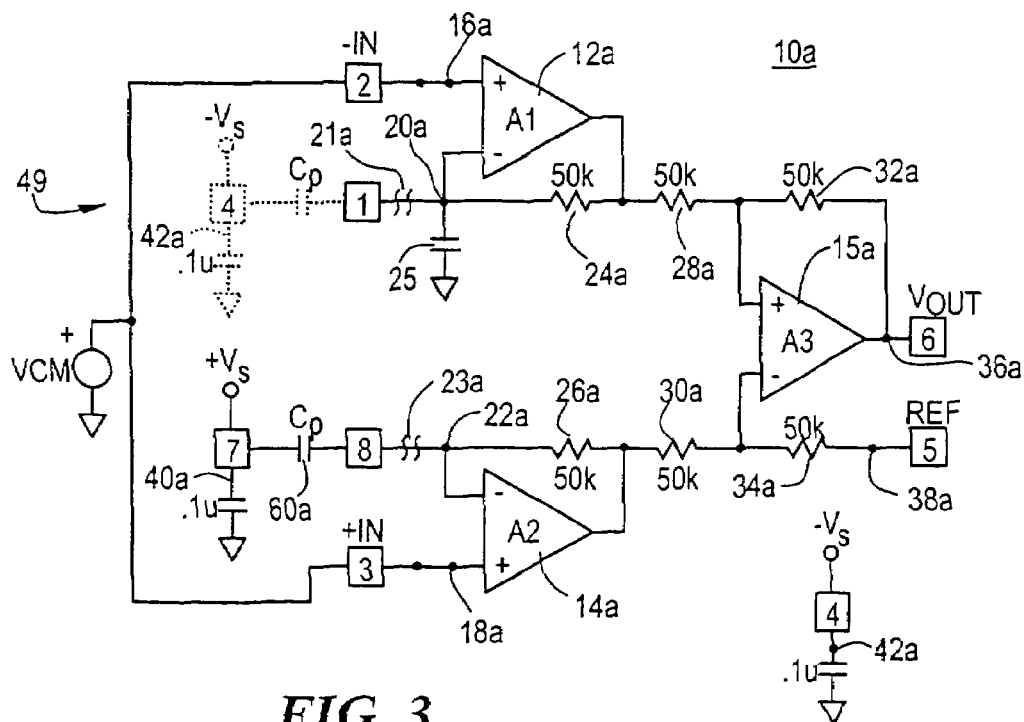
FIG. 3 is schematic diagram similar to FIG. 2, showing the cause of the common mode rejection ratio fall off as realized by this invention and one solution to the problem.

Referring now to FIG. 3 it can be seen that when pin 7 is close to pin 8 the parasitic capacitance $C_P$ 60a occurs between those two pins. This introduces a current into the feedback loop of amplifier 14a which unbalances it with respect to the operation of its companion amplifier 12a. It can be seen that as the frequency increases and the impedance of the capacitance $C_P$ 60a decreases the gain of amplifier 14a will increase. This increase in gain, not actually reflecting an input signal, causes an error in so far as it shows a differential signal between the output of operational amplifier 14a and amplifier 12a which is detected by amplifier 15a and presented at the output as an indication of the signal.

Thus, as taught herein, there are a number of ways that the problem can be solved by repatterning the terminal to pin connections. First the gain resistance terminals 20a and 22a can simply not be connected to pins 1 and 8 as shown at breaks 21a and 23a so that they are not exposed to the power supply +Vs on pin 7. In another approach the other power supply pin 4 for power supply −Vs can be positioned adjacent pin 1 as shown in phantom 49 in FIG. 3 so that both gain resistance pins, 1 and 8, have a package capacitance $C_P$. In this way the package capacitance has not been eliminated but it has been balanced so that the output of amplifiers 12a and 14a will be equally effected which will minimize or eliminate any erroneous differential signal and prevent amplifier 15a from responding to an improper input differential signal.

Figure 4:
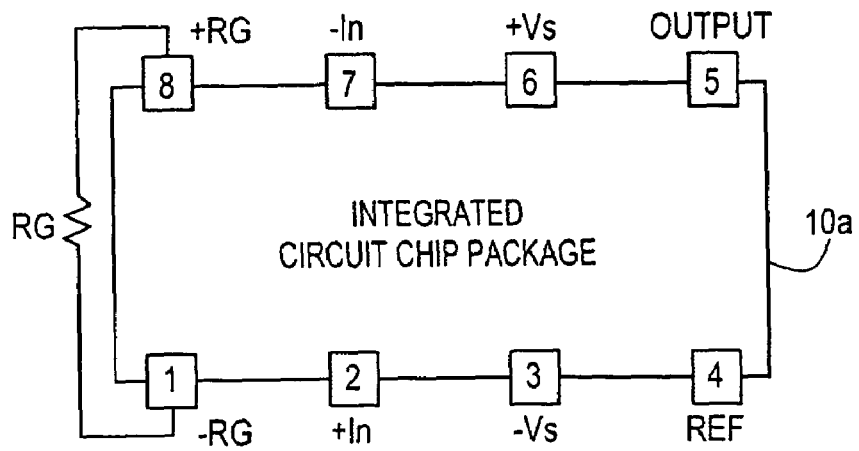
FIG. 4 is a schematic block diagram showing a repatterned integrated circuit chip package which represents another solution to the problem according to this invention.

A third way of solving the problem is shown in FIG. 4 where the pins have been repatterned as shown. The gain resistance pins are still pins 1 and 8, the input pins are now pins 2 and 7, the power supply pins are pins 3 and 6 and the output pins are pins 4 and 5. In this way the power supply pins 6 and 3, +Vs and −Vs respectively, have not only been moved an equal distance away from the gain resistance pins 1 and 8, but they also have placed interstitially of the other pins, namely pins 7 and 2, the input pins, which are not power supply pins or AC ground pins and so there will be no significant capacitive coupling which would give rise to the package capacitance and the incumbent common mode rejection errors. A fourth way to repattern the package is to add a discrete capacitor 25, FIG. 3, at one gain resistor terminal to balance the package capacitance on the other gain resistor terminal.

Figure 5:
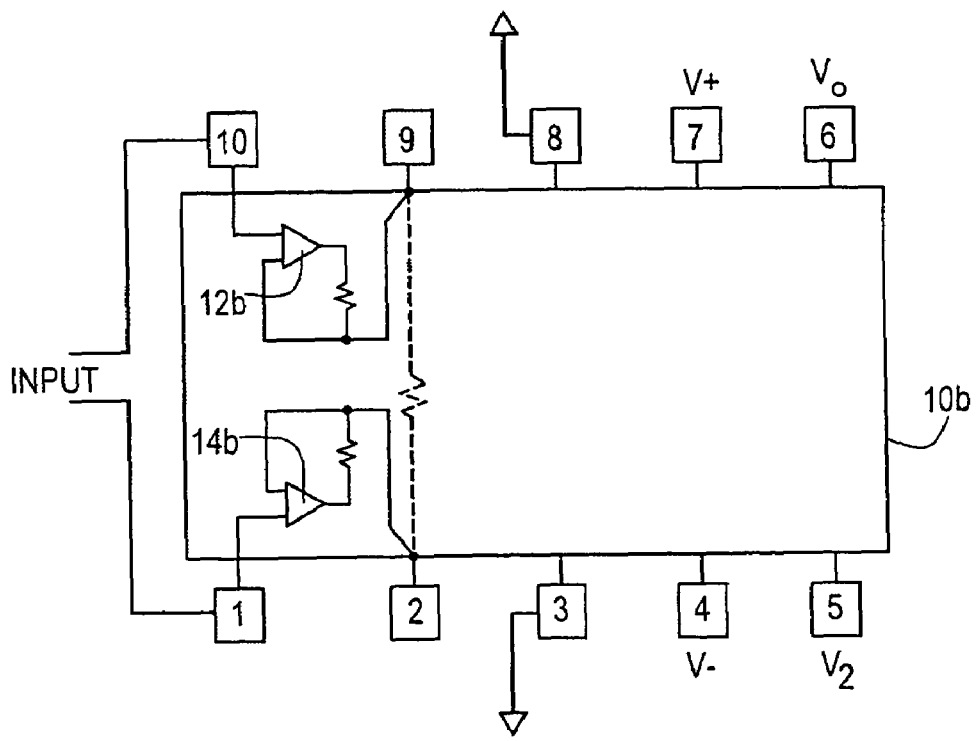
FIG. 5 is a view similar to FIG. 4, showing another alternative solution to the problem realized by this invention.
Figure 6:
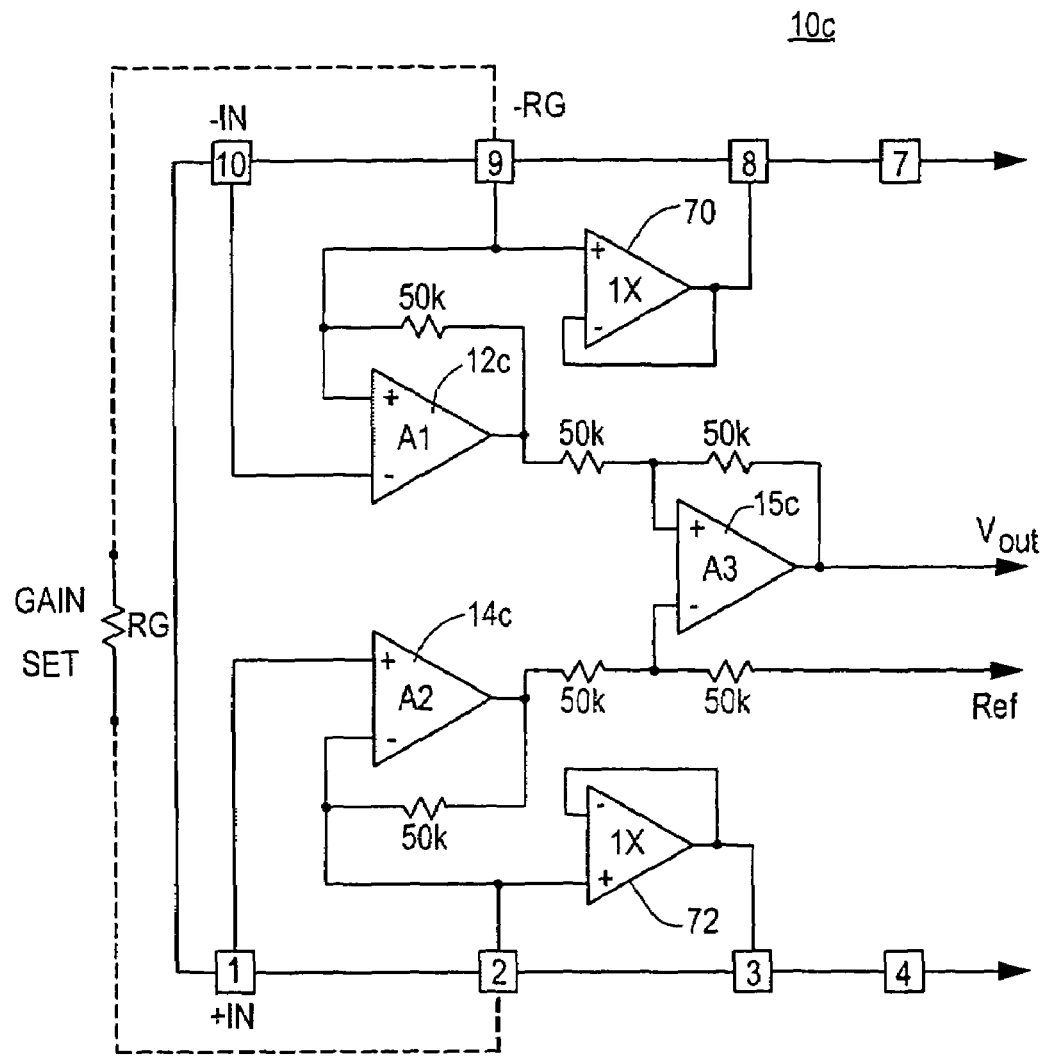
FIG. 6 is a schematic diagram of a portion of an integrated circuit chip package showing yet another solution to the problem realized by this invention.

Although thus far the description of the specific embodiment has been with respect to an instrumentation amplifier and to a package which has 8 pins, neither of these are limitations on the invention as the invention works with any similar circuit to overcome the package capacitance problem and regardless of the number of pins involved. For example as shown in FIG. 5, integrated circuit chip package 10b includes ten pins, numbered 1-10. Pins 1 and 10 are connected to the input signal, pins 2 and 9 are connected to the gain resistance terminals, pins 8 and 3 are connected to ground, pins 7 and 4 are connected to power supplies V+ and V−, and pins 6 and 5 are connected to the output $V_{out}$ and $V_{ref}$. In this way the power supply pins 7 and 4 are not only removed from gain resistance pins 9 and 2, they are removed with another set of pins between them which substantially reduces the capacitive coupling and thus the package capacitance between them. But they are also spaced by approximately an equal amount so that any error that did occur would be balanced and would only minimally affect the differential signal produced. In addition the separating pins 8 and 3, between them are inactive pins merely connected to ground which further serves to isolate the power supply pins 7 and 4 from the gain resistor pins 9 and 2. However, since there is a difference in the potential between pins 9 and 2 on the one hand, and pins 8 and 3 on the other, there can still be some capacitive coupling which could interfere with operation of the circuit. To overcome even this problem the solution shown in FIG. 6 is provided wherein the grounding of pins 8 and 3 has been eliminated and instead each is driven by a buffer amplifier 70 and 72 respectively which maintains the respective pins 8 and 3 at the same voltage as the voltage on pins 9 and 2, respectively, so that there is no capacitive coupling and the package capacitance problem is eliminated. Although FIG. 6 and FIG.

5 are shown with ten pins, this is not a necessary limitation as stated previously the number of pins does not affect the invention and could be any number six, ten, twelve, eighteen, or any chosen number n.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A repatterned integrated circuit chip package comprising: first and second power supply terminals; first and second input terminals; first and second output terminals; and first and second gain resistor terminals; a plurality of connection pins on said package for interconnecting with said terminals; said first and second power supply terminals, input terminals and output terminals being connected to selected ones of said pins, said first and second gain resistor terminals being unattached to any pins for reducing package capacitance respectively between the first and second gain resistor terminals and the pins connected to the first and second power supply terminals to reduce common mode error with frequency.

2. The repatterned integrated circuit chip package of claim 1 in which one of said output terminals and one of said power supply terminals are connected together and to a single pin.

3. A repatterned integrated circuit chip package comprising: first and second power supply terminals; first and second input terminals; first and second output terminals; first and second gain resistor terminals; a plurality of connection pins on said package for interconnecting with said terminals; and a compensating capacitor connected to one of said gain resistor terminals to balance the effect of the parasitic package capacitance between one of the pins connected to the first and second power supply terminals and the pins connected to the other gain resistor terminals to reduce the common mode error with frequency.

4. The repatterned integrated circuit chip package of claim 3 in which one of said output terminals and one of said power supply terminals are connected together and to a single pin.

5. The repatterned integrated circuit chip package of claim 3 in which the compensating capacitor is a discrete capacitor.

* * * * *